(12) United States Patent
Ma et al.

US011257954B2

(10) Patent No.: US 11,257,954 B2
(45) Date of Patent: Feb. 22, 2022

(54) THIN FILM TRANSISTOR AND MANUFACTURING METHOD THEREOF, AND DISPLAY APPARATUS

(71) Applicant: BOE Technology Group Co., Ltd., Beijing (CN)

(72) Inventors: Xiaochen Ma, Beijing (CN); Guangcai Yuan, Beijing (CN); Ce Ning, Beijing (CN); Xin Gu, Beijing (CN); Hehe Hu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/959,179

(22) PCT Filed: Nov. 19, 2019

(86) PCT No.: PCT/CN2019/119483
§ 371 (c)(1),
(2) Date: Jun. 30, 2020

(87) PCT Pub. No.: WO2020/143335
PCT Pub. Date: Jul. 16, 2020

(65) Prior Publication Data
US 2021/0226064 A1    Jul. 22, 2021

(30) Foreign Application Priority Data
Jan. 9, 2019 (CN) .......................... 201910020547.0

(51) Int. Cl.
*H01L 29/786* (2006.01)
*H01L 29/66* (2006.01)
*H01L 29/417* (2006.01)

(52) U.S. Cl.
CPC .. *H01L 29/78603* (2013.01); *H01L 29/41733* (2013.01); *H01L 29/66742* (2013.01); *H01L 29/78696* (2013.01)

(58) Field of Classification Search
CPC ......... H01L 29/78603; H01L 29/41733; H01L 29/66742; H01L 29/78696
(Continued)

(56) References Cited

U.S. PATENT DOCUMENTS

2007/0221958 A1  9/2007 Aoki
2013/0043479 A1  2/2013 Kim et al.
(Continued)

FOREIGN PATENT DOCUMENTS

CN   101043068 A   9/2007
CN   102723310 A   10/2012
(Continued)

OTHER PUBLICATIONS

International search report of PCT application No. PCT/CN2019/119483 dated Feb. 21, 220.
(Continued)

*Primary Examiner* — Tong-Ho Kim
(74) *Attorney, Agent, or Firm* — Fay Sharpe LLP

(57) ABSTRACT

Provided are a thin film transistor including: a base cushion layer having a recessed portion, base insulating layer, source-drain layer and active layer. The base insulating layer is located on a side of the base cushion layer where the recessed portion is located, and has a first and second partition walls that are spaced apart, and an orthographic projection region of a gap region between the first and second partition walls onto the base cushion layer is located at a region where the recessed portion is located; and both orthographic projection regions of the first and second partition walls onto the base cushion layer partially overlap (Continued)

with the recessed portion region; and both the source-drain layer and the active layer are located on the side of the base insulating layer away from the base cushion layer.

19 Claims, 15 Drawing Sheets

(58) Field of Classification Search
USPC .......................................................... 257/66
See application file for complete search history.

(56) References Cited

U.S. PATENT DOCUMENTS

| 2014/0001475 | A1 | 1/2014 | Wang |
| 2016/0276606 | A1 | 9/2016 | Fong et al. |
| 2016/0365458 | A1 | 12/2016 | Shi et al. |
| 2017/0162711 | A1 | 6/2017 | Clevenger et al. |
| 2017/0263644 | A1 | 9/2017 | Chang |
| 2020/0194553 | A1 | 6/2020 | Ma et al. |
| 2021/0167155 | A1* | 6/2021 | Xu ................... H01L 29/78633 |

FOREIGN PATENT DOCUMENTS

| CN | 103000692 A | 3/2013 |
| CN | 104183648 A | 12/2014 |
| CN | 104538458 A | 4/2015 |
| CN | 105355664 A | 2/2016 |
| CN | 105702623 A | 6/2016 |
| CN | 105932176 A | 9/2016 |
| CN | 109060922 A | 12/2018 |
| CN | 109742155 A | 5/2019 |

OTHER PUBLICATIONS

First office action of Chinese application No. 201910020547.0 dated Apr. 20, 2020.

* cited by examiner

THIN FILM TRANSISTOR AND MANUFACTURING METHOD THEREOF, AND DISPLAY APPARATUS

CROSS-REFERENCE TO RELATED APPLICATION

The present application is a 371 of PCT/CN2019/119483 filed on Nov. 19, 2019, which claims priority to the Chinese Patent Application No. 201910020547.0, filed on Jan. 9, 2019, and entitled "THIN FILM TRANSISTOR AND MANUFACTURING METHOD THEREFOR, DEVICE, CHIP AND DISPLAY APPARATUS", which is incorporated herein by reference in its entirety.

TECHNICAL FIELD

The present disclosure relates to the technical field of semiconductors, and in particular to a thin film transistor and manufacturing method thereof, and a display apparatus.

BACKGROUND

Thin film transistors serve as an indispensable semiconductor device in chips and display apparatuses. A thin film transistor includes an active layer and a source-drain layer as essential parts, and the source-drain layer includes a source and a drain that are spaced apart.

In the related art, when a source-drain layer of the thin film transistor is to be manufactured, generally, an electrode material layer will be formed first and then a patterning treatment will be performed on the electrode material layer, such that the source-drain layer is obtained.

SUMMARY

The present disclosure provides a thin film transistor and manufacturing method thereof, and a display apparatus. The technical solutions are as follows:

In one aspect, a thin film transistor is provided. The thin film transistor including: a base cushion layer, a base insulating layer, a source-drain layer and an active layer, wherein the basic cushion layer has a recessed portion;

the base insulating layer is located on a side of the base cushion layer where the recessed portion is located; the base insulating layer has, on a side of the base insulating layer away from the base cushion layer, a first partition wall and a second partition wall that are spaced apart, and an orthographic projection region of a gap region between the first partition wall and the second partition wall onto the base cushion layer is located at a region where the recessed portion is located; and both orthographic projection regions of the first partition wall and the second partition wall onto the base cushion layer partially overlap with the region where the recessed portion is located; and both the source-drain layer and the active layer are located on the side of the base insulating layer away from the base cushion layer, and arranged sequentially along a direction away from the base cushion layer.

Optionally, the base cushion layer includes: a first cushion block and a second cushion block that are spaced apart, and the recessed portion is located between the first cushion block and the second cushion block, or, the base cushion layer includes: a substrate, as well as a first bump and a second bump that are spaced apart and located on one side of the substrate close to the base insulating layer, and the recessed portion is located between the first bump and the second bump.

Optionally, a material of the base cushion layer includes a conductive material, the base cushion layer being a first gate layer in the thin film transistor.

Optionally, the thin film transistor further includes: a second gate layer and a first gate insulating layer that are located on a side of the active layer away from the base cushion layer, and the first gate insulating layer is located between the active layer and the second gate layer.

Optionally, the thin film transistor further includes: a third gate layer and a second gate insulating layer that are located on the side of the base cushion layer away from the base insulating layer, and the second gate insulating layer is located between the base cushion layer and the third gate layer.

Optionally, the thin film transistor further includes: a second gate layer and a first gate insulating layer that are located on a side of the active layer away from the base cushion layer, as well as a third gate layer and a second gate insulating layer that are located on the side of the base cushion layer away from the base insulating layer; and the first gate insulating layer is located between the active layer and the second gate layer, and the second gate insulating layer is located between the base cushion layer and the third gate layer.

Optionally, a recession depth of the recessed portion ranges from 5 nm to 50 μm; and a width of the recessed portion ranges from 5 nm to 50 μm in an arrangement direction of a source and a drain in the source-drain layer.

Optionally, a gap between the source and the drain in the source-drain layer ranges from 1 nm to 5 μm.

In another aspect, provided is a method of manufacturing a thin film transistor, which is used in manufacturing the aforesaid thin film transistor, including:

forming a base cushion layer having a recessed portion;

depositing a base insulating layer on a side of the base cushion layer where the recessed portion is located, wherein the base insulating layer has, on a side of the base insulating layer away from the base cushion layer, a first partition wall and a second partition wall that are spaced apart, and an orthographic projection region of a gap region between the first partition wall and the second partition wall onto the base cushion layer is within a region where the recessed portion is located; and both orthographic projection regions of the first partition wall and the second partition wall onto the base cushion layer partially overlap with the region where the recessed portion is located;

depositing a source-drain layer on the side of the base insulating layer away from the base cushion layer; and forming an active layer on a side of the source-drain layer away from the base cushion layer.

Optionally, forming the active layer on the side of the source-drain layer away from the base cushion layer includes:

depositing the active layer on the side of the source-drain layer away from the base cushion layer.

Optionally, forming the base cushion layer having the recessed portion includes:

forming a base material layer; and treating the base material layer with a photoetching technology to obtain the base cushion layer.

Optionally, a material of the base cushion layer includes a conductive material, the base cushion layer being a first gate layer in the thin film transistor.

Optionally, after forming the active layer on the side of the source-drain layer away from the base cushion layer, the method further includes:

forming a first gate insulating layer on a side of the active layer away from the base cushion layer; and forming a second gate layer on a side of the first gate insulating layer away from the base cushion layer.

Optionally, before forming the base cushion layer having the recessed portion, the method further includes:

forming a third gate layer and a second gate insulating layer that are stacked, and forming the base cushion layer having the recessed portion includes:

forming the base cushion layer on a side of the second gate insulating layer away from the third gate layer.

Optionally, the method further includes:

forming, before forming the base cushion layer having the recessed portion, a third gate layer and a second gate insulating layer that are stacked;

forming, after forming the active layer on the side of the source-drain layer away from the base cushion layer, a first gate insulating layer on a side of the active layer away from the base cushion layer; and forming a second gate layer on a side of the first gate insulating layer away from the base cushion layer, and forming the base cushion layer having the recessed portion includes:

forming the base cushion layer on a side of the second gate insulating layer away from the third gate layer.

In yet another aspect, provided is a display apparatus, including the aforesaid thin film transistor.

DETAILED DESCRIPTION

For clearer descriptions of the principles, technical solutions and advantages of the present disclosure, the implementations of the present disclosure are described in detail below in combination with the accompanying drawings.

Due to the low precision of patterning treatment in the related art, the gap between a source and a drain in the thin film transistor tends to be large, resulting in the large size of the thin film transistor. The embodiments of the present disclosure provide a thin film transistor with a small size. The source-drain layer in the thin film transistor can be manufactured by using a deposition method. As the deposition method used in forming the film layer has a high precision, the gap between the source and the drain, as well as the size of the thin film transistor, can be reduced. The thin film transistor and manufacturing method thereof provided by the embodiments of the present disclosure are described below.

Figure 1:
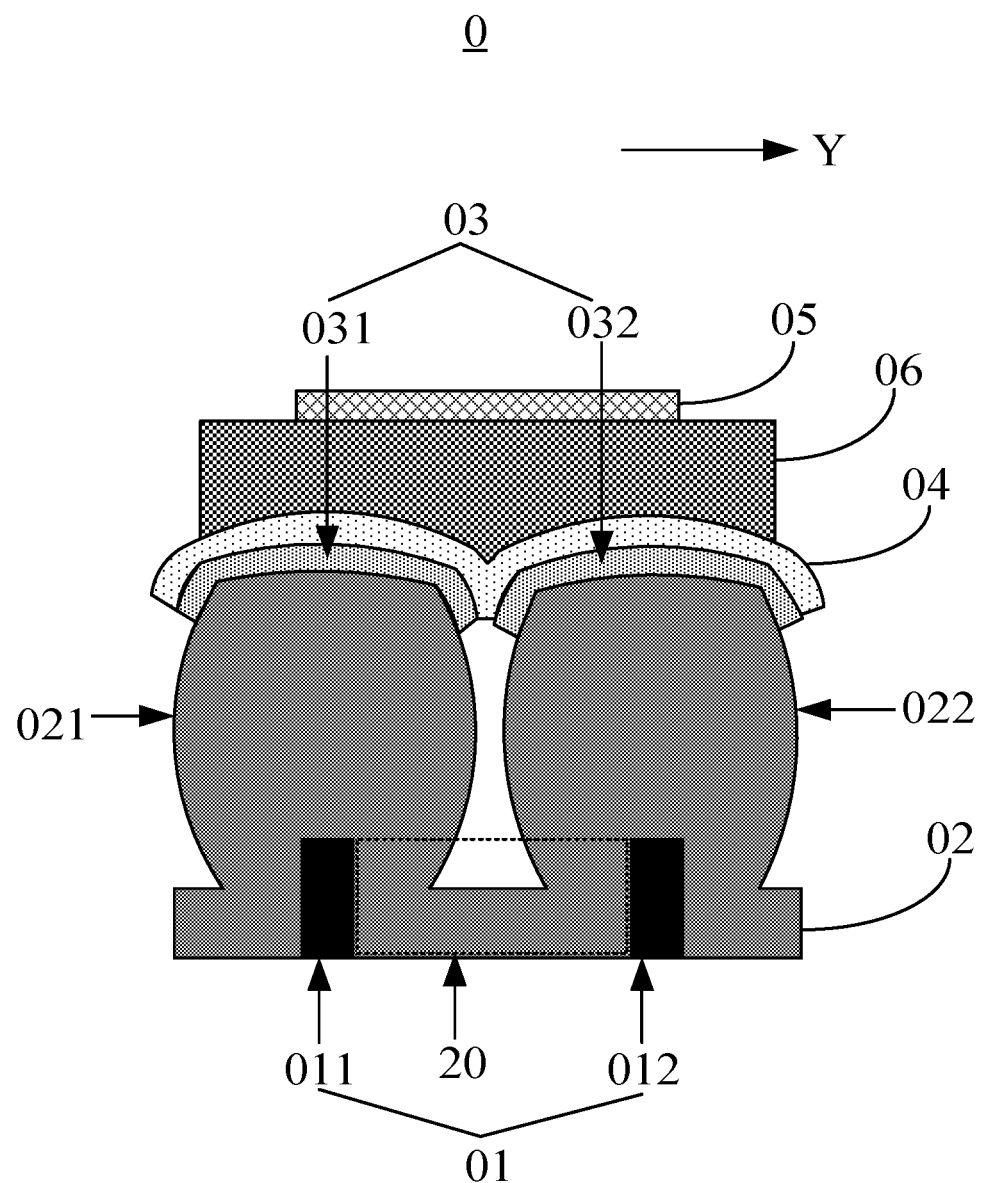
FIG. 1 is a structural schematic diagram of a thin film transistor provided by an embodiment of the present disclosure.

Exemplarily, FIG. 1 is a structural schematic diagram of a thin film transistor provided by an embodiment of the present disclosure. As shown in FIG. 1, the thin film transistor 0 may include: a base cushion layer 01, a base insulating layer 02, a source-drain layer 03 and an active layer 04.

Here, the base cushion layer 01 has a recessed portion 20. The base insulating layer 02 is located on a side of the base cushion layer 01 where the recessed portion is located. The base insulating layer 02 has, on a side of the base insulating layer 02 away from the base cushion layer 01, a first partition wall 021 and a second partition wall 022 that are spaced apart, and an orthographic projection region of a gap region between the first partition wall 021 and the second partition wall 022 onto the base cushion layer 01 is located within a region where the recessed portion 20 is located; and orthographic projection regions of the first partition wall 021 and the second partition wall 022 onto the base cushion layer 01 partially overlap with the region where the recessed portion 20 is located.

Both the source-drain layer 03 and the active layer 04 are located on the side of the base insulating layer 02 away from the base cushion layer 01, and are arranged sequentially along a direction away from the base cushion layer 01.

Exemplarily, the source-drain layer 03 may include: a source 031 located on a side of the first partition wall 021 away from the base cushion layer 01, and a drain 032 located on a side of the second partition wall 022 away from the base cushion layer 01, and a gap is provided between the source 031 and the drain 032. The active layer 04 is located on a side of the source-drain layer 03 away from the base cushion layer 01, and covers the source 031 and the drain 032, so that the active layer 04 is electrically connected to the source 031 and the drain 032. It is to be noted that electrical connection between two structures refers to that the two structures are connected and can transmit current to each other.

To sum up, in the thin film transistor provided by the embodiment of the present disclosure, as the base insulating layer is stacked on the base cushion layer, the source-drain layer is stacked on the base insulating layer, and the side of the base cushion layer close to the base insulating layer has the recessed portion, a deposition method can be used to form the base insulating layer and the source-drain layer. When the deposition method is used in forming the source-drain layer, the thickness of deposition can be controlled to achieve an accurate control on the gap between the source and the drain in the source-drain layer as obtained from the deposition. Therefore, the gap can be accurately controlled to reach a small dimension, and thus the size of the thin film transistor can be reduced.

Moreover, the deposition method is simpler than a patterning method in forming the source-drain layer. Additionally, the spacing between the source and the drain in the source-drain layer also represents the channel width of the thin film transistor. As the spacing between the source and the drain in the embodiment of the present disclosure is small, the channel width in the thin film transistor is also narrow.

Optionally, as shown in FIG. 1, the base cushion layer 01 may include: a first cushion block 011 and a second cushion block 012 that are spaced apart, and the recessed portion 20 is located between the first cushion block 011 and the second cushion block 012. That is, the recessed portion 20 is resulted from the first cushion block 011 and the second cushion block 012.

It is to be noted that in the embodiment of the present disclosure, the base cushion layer serves as a base and the process of depositing the film layer includes the following two stages: in a first stage, the film layer deposited on the base cushion layer is relatively thin, and the surface of the film layer away from the base cushion layer has two partition walls that are spaced apart; and in a second stage, the film layer deposited on the base cushion layer is gradually getting thicker, and the two partition walls join together at the surface of the film layer. In the embodiment of the present disclosure, the process of depositing the base insulating layer and the process of depositing the source-drain layer can be controlled as being within the first stage, such that the gap remains between the source and the drain in the source-drain layer obtained from the deposition. Thereafter, if the deposition method is used in forming the active layer, the process of depositing the active layer can be controlled to include the second stage, such that the active layer can connect the source and the drain.

Exemplarily, the method for depositing the base insulating layer and the source-drain layer in the embodiment of the present disclosure may be a Physical Vapor Deposition (PVD) method or a Chemical Vapor Deposition (CVD) method. The PVD includes magnetron sputtering or thermal evaporation or other PVD methods. The CVD includes a Plasma Enhanced Chemical Vapor Deposition (PECVD) method or other CVD methods.

Optionally, the active layer 04 is located on a side of the source-drain layer 03 away from the base cushion layer 01, and the active layer 04 may include: a first region (not marked in FIG. 1) on the source 031, a second region (not marked in FIG. 1) on the drain 032, and a middle region (not marked in FIG. 1) connecting the first region and the second region. The first region may be electrically connected to the source 031, the second region may be electrically connected to the drain 032, and a cross section of the active layer 04 in direction parallel to an arrangement direction of the source-drain layer 03 and the active layer 04 and parallel to an arrangement direction of the source layer and drain layer may be in a roughly M shape. Optionally, the active layer 04 can be obtained in any method (such as a deposition method or patterning treatment method), which is not limited by the embodiment of the present disclosure. The base cushion layer 01 may be obtained by using the patterning treatment method.

Optionally, a recession depth of the recessed portion 20 of the base cushion layer 01 may range from 5 nm to 50 μm. Optionally, in an arrangement direction Y of the source 031 and the drain 032, a width of the recessed portion 20 may range from 5 nm to 50 μm (that is, a gap between the first cushion block 011 and the second cushion block 012 may range from 5 nm to 50 nm).

In the embodiment of the present disclosure, by controlling the thickness of the deposited film layer, the thin film transistor having a small size can be manufactured. For example, the gap between the source 031 and the drain 032 in the thin film transistor can reach a micron-scale or a nano-scale gap. Exemplarily, the gap between the source 031 and the drain 032 can range from 1 nm to 5 μm.

Optionally, the thin film transistor 0 provided by the embodiment of the present disclosure may be a thin film transistor of a multi-gate structure (such as a dual-gate structure). In the thin film transistor of the dual-gate structure as illustrated, two gates of the thin film transistor are respectively located on two sides of the active layer. Referring again to FIG. 1, the base cushion layer 01 is made of a conductive material, and the base cushion layer 01 serves as a first gate layer of the thin film transistor 0. The thin film transistor 0 may further include: a second gate layer 05 and a first gate insulating layer 06 that are located on a side of the active layer 04 away from the source-drain layer 03, and the first gate insulating layer 06 is located between the active layer 04 and the second gate layer 05.

The second gate layer 05 can be obtained by the patterning treatment method, and the first gate insulating layer 06 can be obtained by methods such as deposition or coating. Optionally, the base cushion layer 01 can also not be multiplexed as the first gate layer; and in this case, the base cushion layer 01 may be made of any material, and the gate of the thin film transistor 0 is only composed of the second gate layer 05 and is located on the side of the active layer 04 away from the source-drain layer 03. In this case, the thin film transistor 0 is of a top gate structure.

Optionally, the second gate layer 05 may include one gate or two gates spaced apart, which is not limited by the embodiment of the present disclosure. FIG. 1 takes a second gate layer 05 only including one gate (not marked in FIG. 1) as an example.

It is to be noted that FIG. 1 only shows one construction of the thin film transistor 0. Optionally, the thin film transistor 0 may also be in another construction different from that shown in FIG. 1, which is not limited by the embodiment of the present disclosure. Other constructions of the thin film transistor 0 will be respectively illustrated below.

Figure 2:
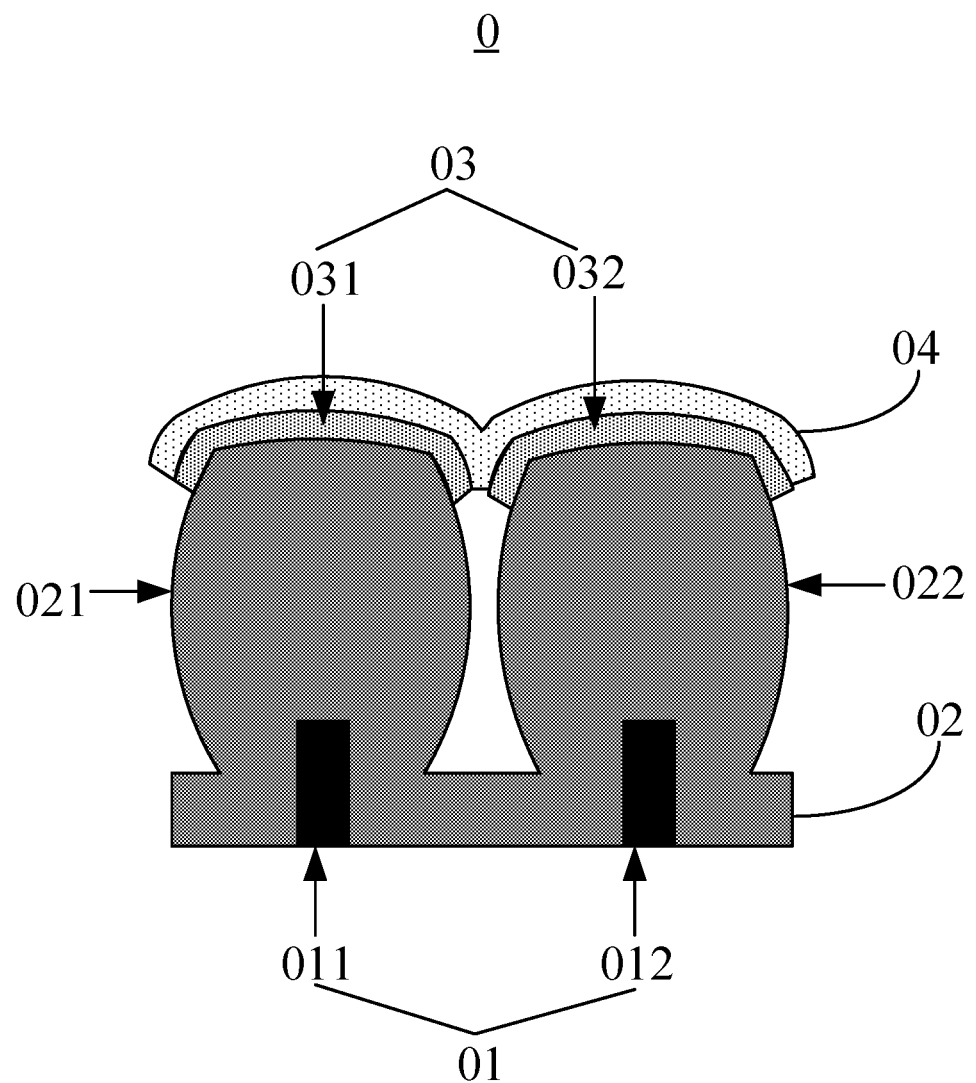
FIG. 2 is a structural schematic diagram of another thin film transistor provided by an embodiment of the present disclosure.

Exemplarily, FIG. 2 is a structural schematic diagram of another thin film transistor provided by an embodiment of the present disclosure. As shown in FIG. 2, the thin film transistor 0 may not include the second gate layer and the first gate insulating layer. In this case, the thin film transistor only includes the base cushion layer 01 as a gate.

Figure 3:
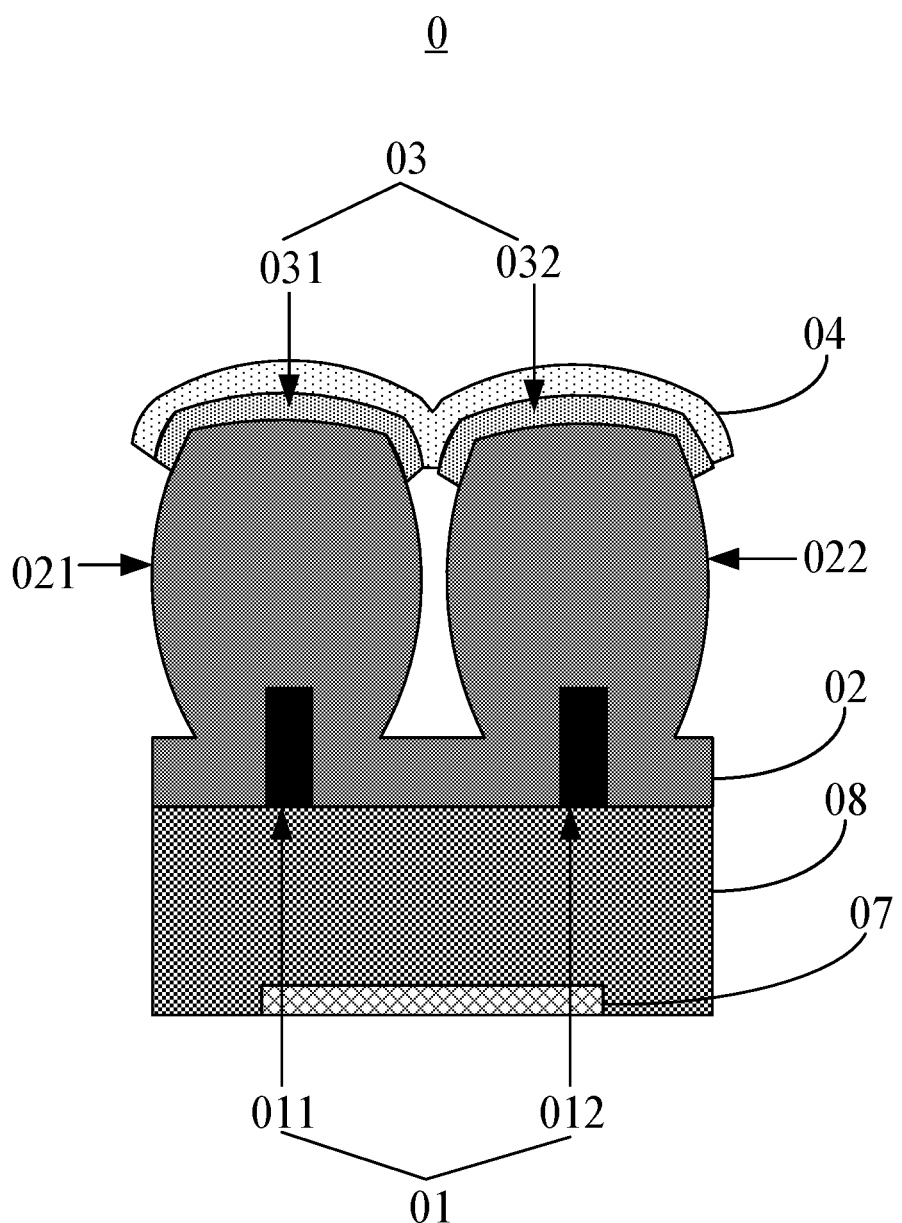
FIG. 3 is a structural schematic diagram of still another thin film transistor provided by an embodiment of the present disclosure.

Additionally and exemplarily, FIG. 3 is a structural schematic diagram of still another thin film transistor provided by an embodiment of the present disclosure. As shown in FIG. 3, on the basis of FIG. 1, the thin film transistor 0 may not include the second gate layer and the first gate insulating layer, and the base cushion layer 01 may be not multiplexed as the first gate layer. In this case, the base cushion layer 01 may be made of any material. The thin film transistor 0 may further include: a third gate layer 07 and a second gate insulating layer 08 that are located on the side of the base cushion layer 01 away from the base insulating layer 02, and the second gate insulating layer 08 is located between the base cushion layer 01 and the third gate layer 07. Optionally, the third gate layer 07 may include one gate or two gates spaced apart, which is not limited by the embodiment of the present disclosure. FIG. 3 only takes the third gate layer 07 including one gate (not marked in FIG. 3) as an example. The third gate layer 07 can be obtained by the patterning treatment, and the second gate insulating layer 08 can be obtained by methods such as deposition or coating.

Figure 4:
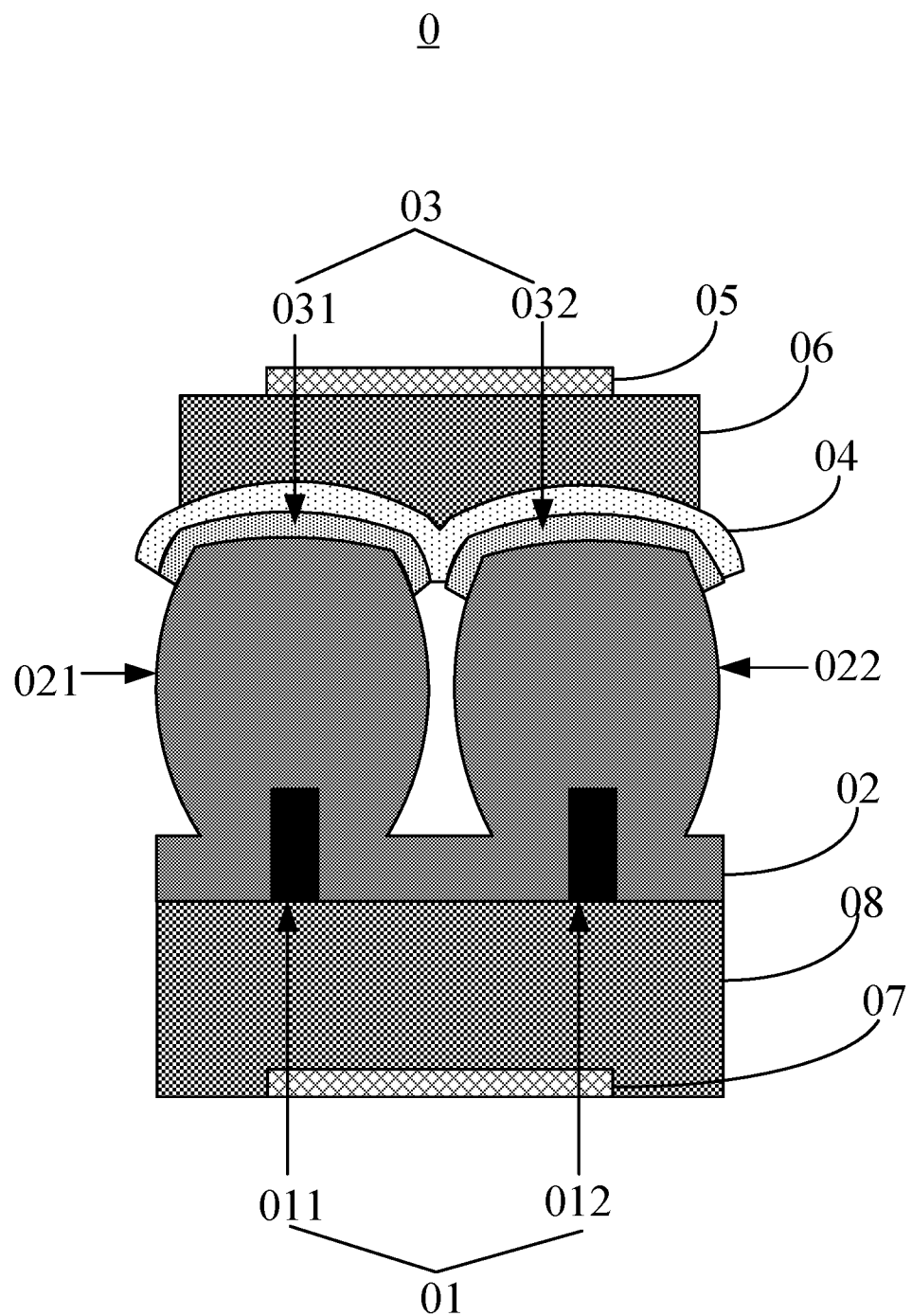
FIG. 4 is a structural schematic diagram of still another thin film transistor provided by an embodiment of the present disclosure.

Additionally and exemplarily, FIG. 4 is a structural schematic diagram of still another thin film transistor provided by an embodiment of the present disclosure. As shown in FIG. 4, on the basis of FIG. 1, the base cushion layer 01 may be not multiplexed as the first gate layer. In this case, the base cushion layer 01 may be made of any material. The thin film transistor 0 may not only include a second gate layer 05 and a first gate insulating layer 06, but the thin film transistor 0 may also include: a third gate layer 07 and a second gate insulating layer 08 that are located on the side of the base cushion layer 01 away from the base insulating layer 02; and the second gate insulating layer 08 is located between the base cushion layer 01 and the third gate layer 07. Optionally, the second gate layer 05 may include one gate or two gates spaced apart, and the third gate layer 07 may include one gate or two gates spaced apart, which is not limited by the embodiment of the present disclosure. FIG. 4 only takes the second gate layer 05 including one gate (not marked in FIG. 4) and the third gate layer 07 including one gate (not marked in FIG. 4) as an example. The second gate layer 05 and the third gate layer 07 can be obtained by patterning treatment, and the first gate insulating layer 06 and the second gate insulating layer 08 can be obtained by methods such as deposition or coating.

It is to be noted that the embodiment of the present disclosure (as shown in FIG. 1 to FIG. 4) only takes the base cushion layer 01 including the first cushion block 011 and the second cushion 012 as an example. Optionally, the base cushion layer may further be implemented by other methods.

Figure 5:
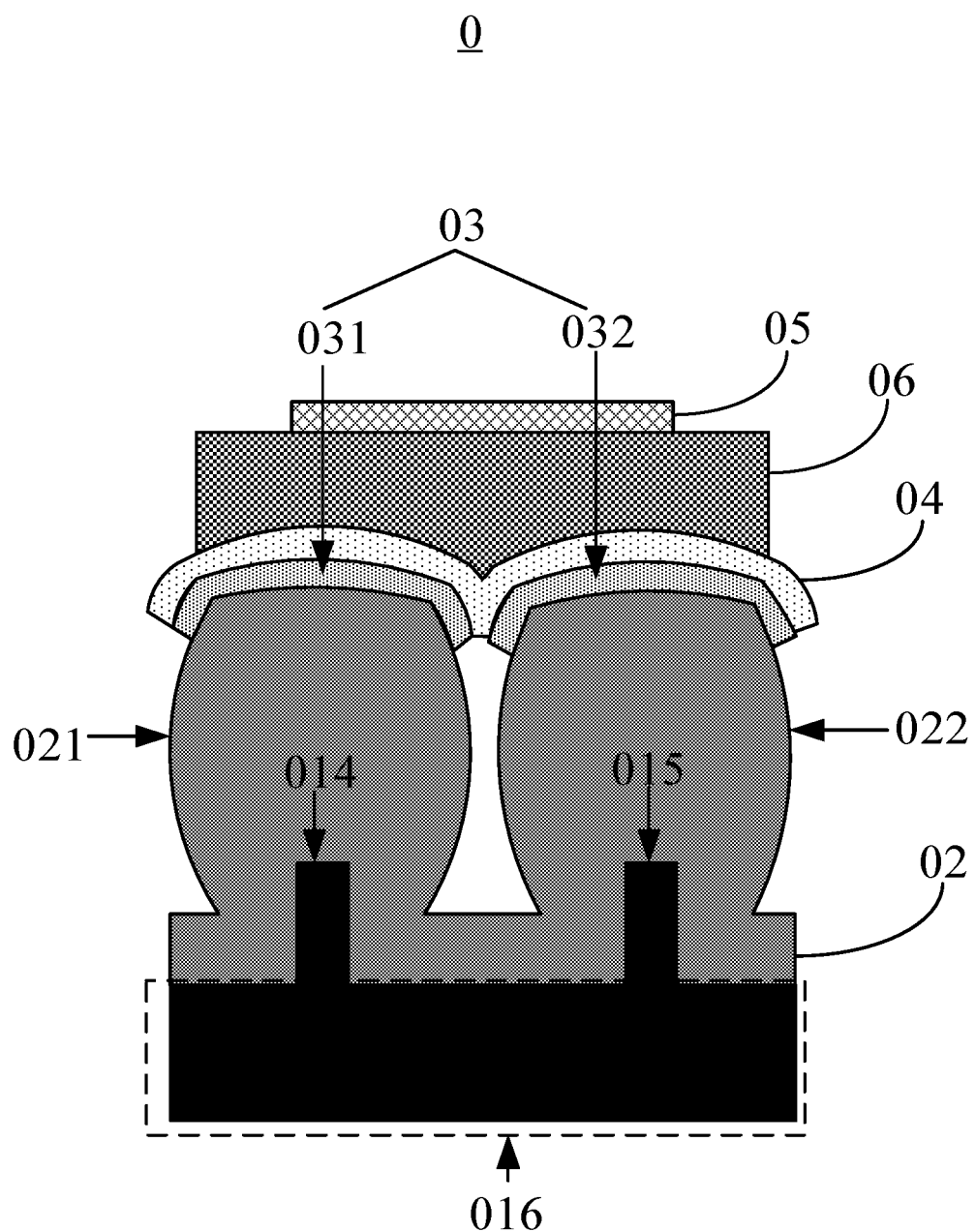
FIG. 5 is a structural schematic diagram of still another thin film transistor provided by an embodiment of the present disclosure.

For example, as shown in FIG. 5, the base cushion layer 01 includes a substrate 016, as well as a first bump 014 and a second bump 015 that are located on a side of the substrate 016 close to the base insulating layer 02, and the recessed portion is located between the first bump 014 and the second bump 015.

Figure 6:
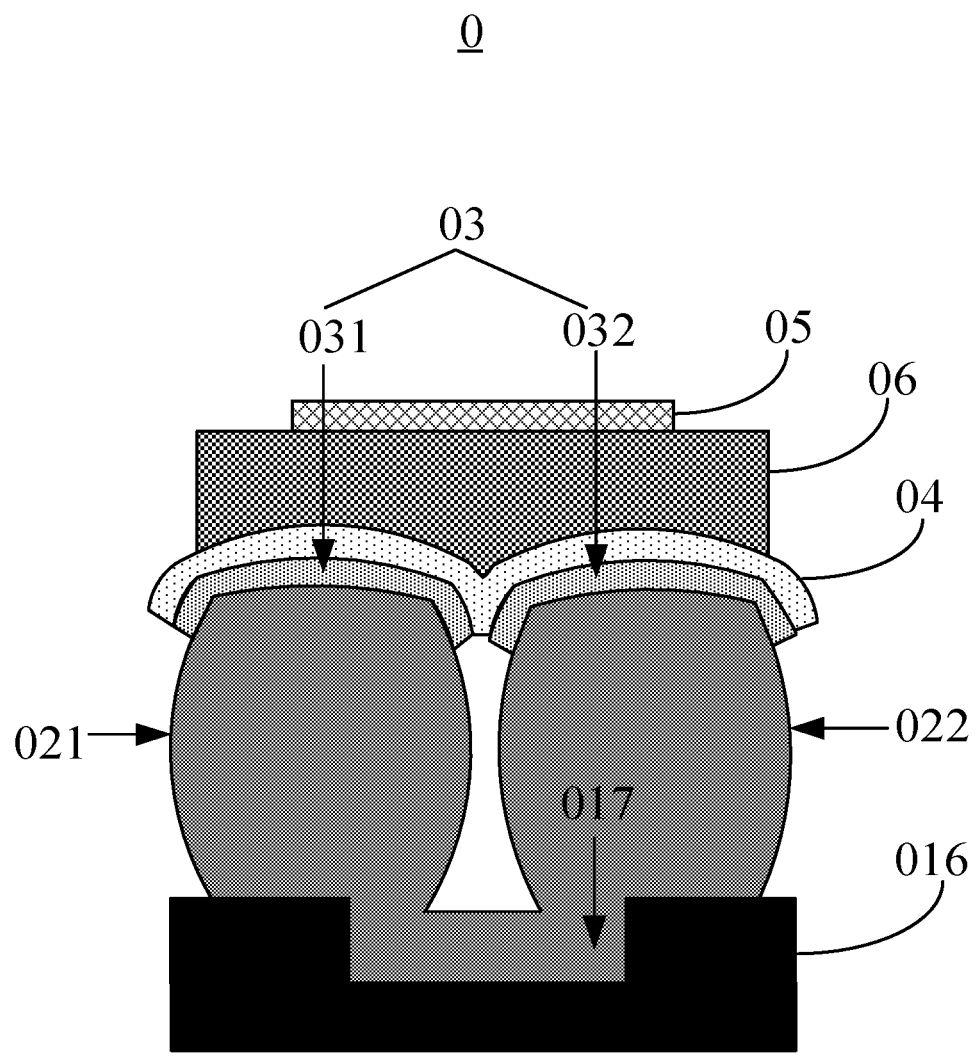
FIG. 6 is a structural schematic diagram of still another thin film transistor provided by an embodiment of the present disclosure.

Further, in an example, as shown in FIG. 6, the base cushion layer 01 may only include the substrate 016, the side of the substrate 016 close to the base insulating layer 02 is provided with a groove 017, and the groove 017 serves as the recessed portion in the base cushion layer 01.

It is to be noted that the embodiment of the present disclosure is exemplified by replacing the base cushion layer 01 in FIG. 1 with the base cushion layer 01 shown in FIG. 5 and FIG. 6. Optionally, the base cushion layer 01 in FIG. 5 and FIG. 6 may also be used to replace the base cushion layer in other thin film transistors provided by the embodiments of the present disclosure, such as the base cushion layer 01 in the thin film transistor shown in FIG. 2, FIG. 3 and FIG. 4.

To sum up, in the thin film transistor provided by the embodiment of the present disclosure, as the base insulating layer is stacked on the base cushion layer, the source-drain layer is stacked on the base insulating layer, and the side of the base cushion layer close to the base insulating layer has the recessed portion, a deposition method can be used to form the base insulating layer and the source-drain layer. When the deposition method is used in forming the source-drain layer, the thickness of deposition can be controlled to achieve an accurate control on the gap between the source and the drain in the source-drain layer as obtained from the deposition. Therefore, the gap can be accurately controlled to reach a small dimension, and thus the size of the thin film transistor can be reduced.

Figure 7:
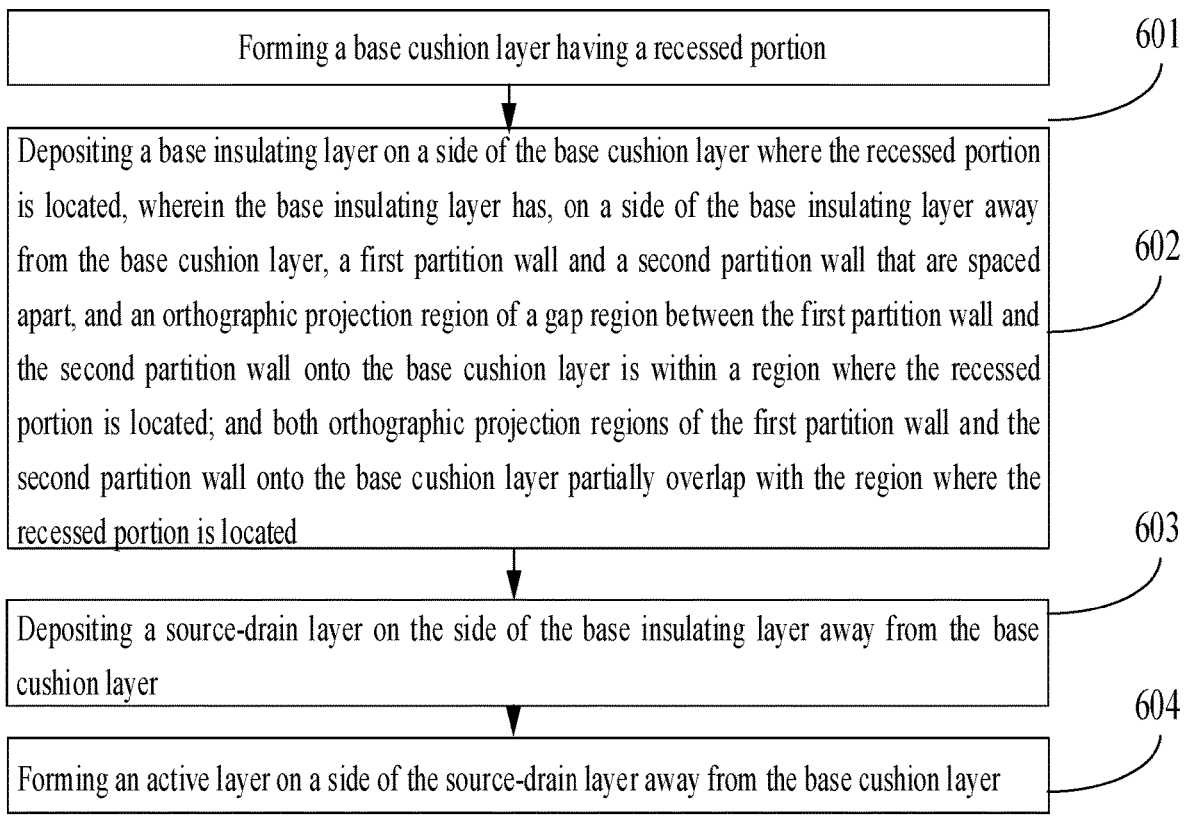
FIG. 7 is a flowchart of a method of manufacturing a thin film transistor provided by an embodiment of the present disclosure.

FIG. 7 is a flowchart showing a method of manufacturing a thin film transistor provided by an embodiment of the present disclosure. The method may be used in manufacturing the thin film transistor 0 shown in FIG. 1, FIG. 2, FIG. 3, FIG. 4, FIG. 5 or FIG. 6. As shown in FIG. 7, the method of manufacturing the thin film transistor may include the following steps.

In step 601, a base cushion layer having a recessed portion is formed.

In step 602, a base insulating layer is deposited on a side of the base cushion layer where the recessed portion is located, wherein the base insulating layer has, on a side of the base insulating layer away from the base cushion layer, a first partition wall and a second partition wall that are spaced apart, and an orthographic projection region of a gap region between the first partition wall and the second partition wall onto the base cushion layer is located within a region where the recessed portion is located; and orthographic projection regions of the first partition wall and the second partition wall onto the base cushion layer partially overlap with the region where the recessed portion is located.

In step 603, a source-drain layer is deposited on the side of the base insulating layer away from the base cushion layer.

In step 604, an active layer is formed on a side of the source-drain layer away from the base cushion layer. To sun up, in the method for manufacturing the thin film transistor provided by this embodiment of the present disclosure, the basic cushion layer having the depressed portion is formed first, and then the basic insulating layer is deposited on the side where the depressed portion in the basic cushion layer is located. Under the action of the depressed portion, the surface of the basic insulating layer away from the basic cushion layer has the first retaining wall and the second retaining wall that are spaced. Then, a conductive material is continuously deposited on the first retaining wall and the second retaining wall, so that the source-drain layer can be obtained by deposition. When the source-drain layer is obtained by deposition, the deposited thickness may be controlled to implement accurate control on the spacing between the source and the drain in the source-drain layer. Therefore, the spacing may be controlled accurately to be small, and thus the size of the thin film transistor can be reduced.

To sun up, in the method of manufacturing the thin film transistor provided by the embodiment of the present disclosure, the base cushion layer having the recessed portion is formed first, and then the base insulating layer is deposited on the side of the base cushion layer where the recessed portion is located. Under the action of the recessed portion, the surface of the base insulating layer away from the base cushion layer may have the first partition wall and the second partition wall that are spaced apart. Then, a conductive material is further deposited on the first partition wall and the second partition wall, so as to obtain the deposited source-drain layer. During the deposition used in forming the source-drain layer, the thickness of deposition can be controlled to achieve an accurate control on the gap between the source and the drain in the source-drain layer. Therefore, the gap can be accurately controlled to reach a small dimension, and thus the size of the thin film transistor can be reduced.

Figure 8:
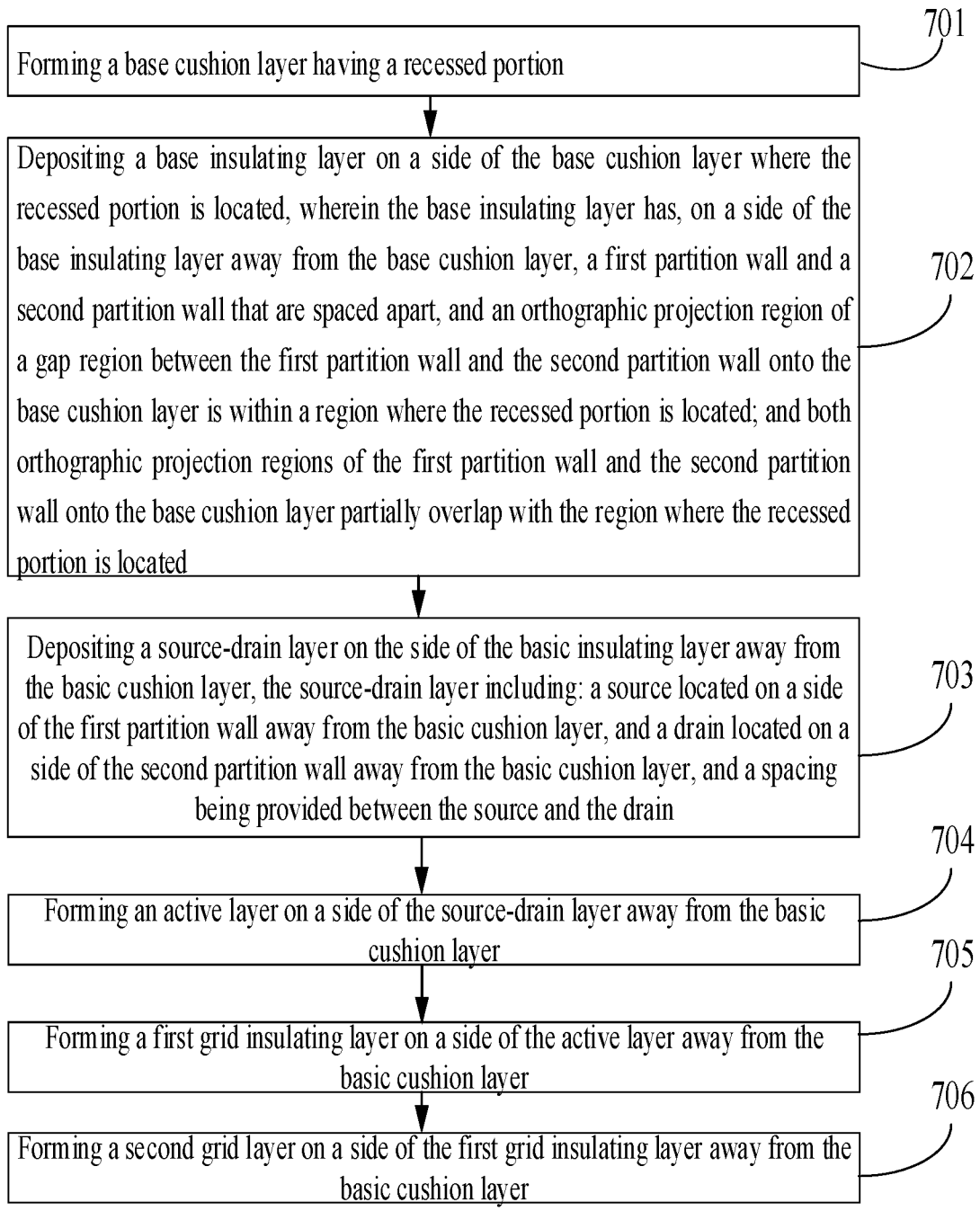
FIG. 8 is a flowchart of a method of manufacturing another thin film transistor provided by an embodiment of the present disclosure.

FIG. 8 is a flowchart showing another method of manufacturing a thin film transistor provided by an embodiment of the present disclosure. The method can be used in manufacturing the thin film transistor shown in FIG. 1. As shown in FIG. 8, the method of manufacturing the thin film transistor may include the following steps.

In step 701, a base cushion layer having a recessed portion is formed.

Exemplarily, the thin film transistor may be prepared on a substrate. Before step 701, a substrate (such as a glass substrate or other hard substrates, or a polyimide substrate or other flexible substrates) is needed to be provided and cleaned.

Figure 9:
FIG. 9 is a schematic diagram of a manufacturing process of a thin film transistor provided by an embodiment of the present disclosure.

As shown in FIG. 9, a base material layer 102 may be first formed on the substrate 101 in step 701. The base material layer 102 may be made of a conductive material, such as metal or tin indium oxide. Exemplarily, methods such as coating, PVD or CVD may be used to form a layer of base material on the substrate 101 to obtain the base material layer 102. It is to be noted that when the base cushion layer is not multiplexed as the first gate layer, the base material layer 102 may be made of any material, such as the conductive material or the insulating material.

Figure 10:
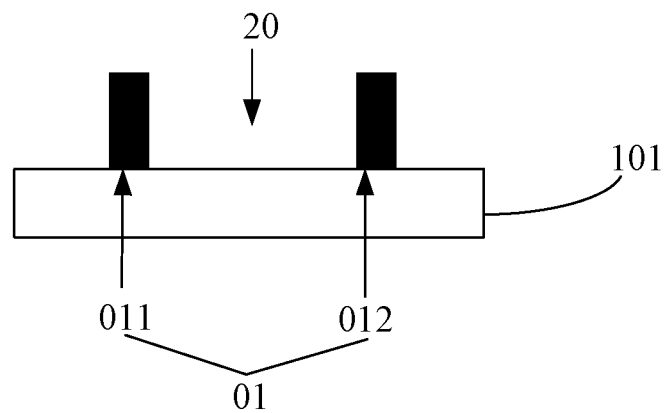
FIG. 10 is a schematic diagram of a manufacturing process of another thin film transistor provided by an embodiment of the present disclosure.

After the base material layer 102 is formed, the base material layer 102 in FIG. 9 may be treated by using a photoetching technology to obtain the base cushion layer 01 shown in FIG. 10. The base cushion layer 01 has the recessed portion. Optionally, the base cushion layer 01 includes: a first cushion block 011 and a second cushion block 012 that are spaced apart, and the recessed portion 20 is located between the first cushion block 011 and the second cushion block 012.

The photoetching technology includes a patterning technology and an etching technology. Examples of the patterning technology include ultraviolet exposure and development, electron beam exposure and development, laser-based direct writing technology or nanoimprinting, etc. Examples of the etching technology include dry etching, wet etching, reactive ion-beam etching, laser ablation or high-temperature calcination, etc.

In step 702, a base insulating layer is deposited on a side of the base cushion layer where the recessed portion is located, wherein the base insulating layer has, on a side of the base insulating layer away from the base cushion layer, a first partition wall and a second partition wall that are spaced apart, and an orthographic projection region of a gap region between the first partition wall and the second partition wall onto the base cushion layer is located within a region where the recessed portion is located; and orthographic projection regions of the first partition wall and the second partition wall onto the base cushion layer partially overlap with the region where the recessed portion is located.

Figure 11:
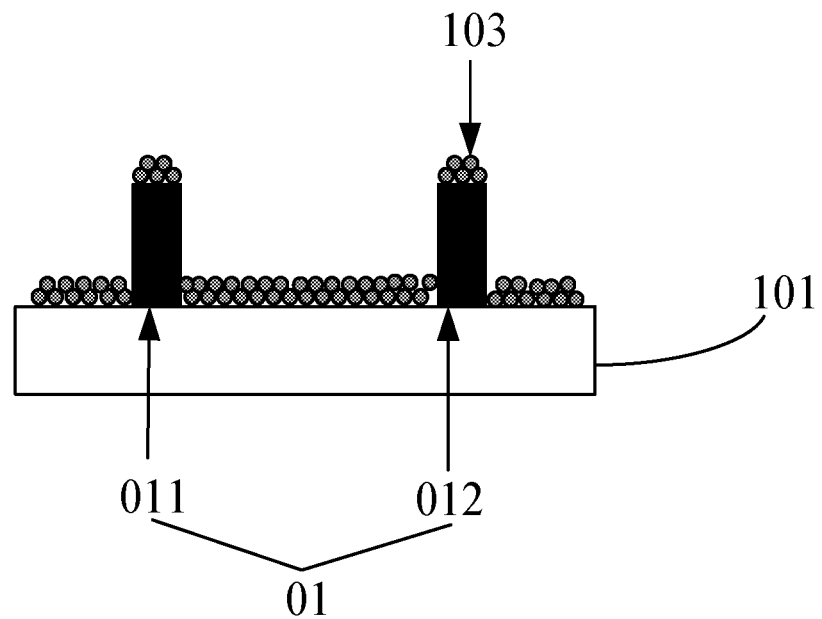
FIG. 11 is a schematic diagram of a manufacturing process of another thin film transistor provided by an embodiment of the present disclosure.
Figure 12:
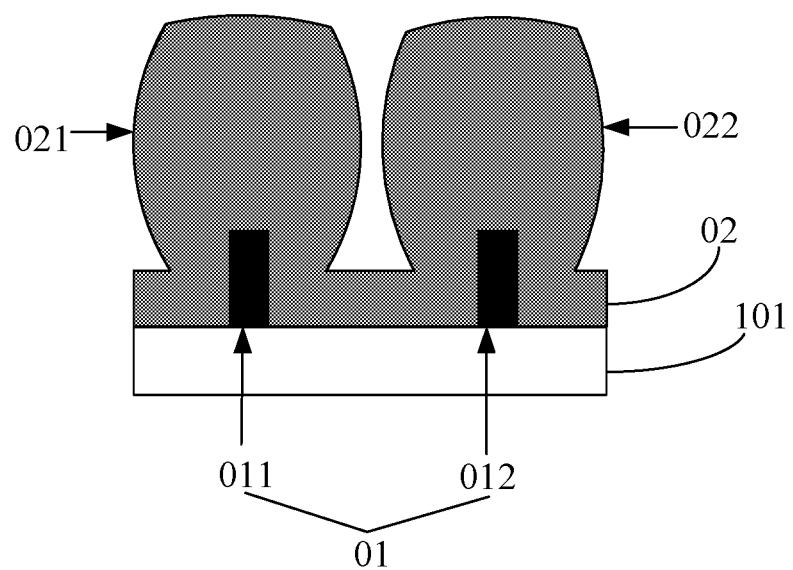
FIG. 12 is a schematic diagram of a manufacturing process of another thin film transistor provided by an embodiment of the present disclosure.

After the base cushion layer is prepared, as shown in FIG. 11, an insulating material 103 may be deposited on the base cushion layer 01 to obtain the base insulating layer 02 shown in FIG. 12. Exemplarily, the base insulating layer 02 in the embodiment of the present disclosure can be obtained by the PVD or CVD method. It is to be noted that when the insulating material is deposited, it is necessary to control the thickness of deposited insulating material, so that the side of the base insulating layer 02 away from the base cushion layer 01 forms the first partition wall 021 and the second partition wall 022 that are spaced apart (as shown in FIG. 12). Moreover, it is further necessary to guarantee that a source and a drain deposited from an electrode material in a subsequent step are also spaced apart.

The first partition wall 021 and the second partition wall 022 may be respectively located on opposite sides of the recessed portion, and the orthographic projection regions of the first partition wall 021 and the second partition wall 022 onto the base cushion layer partially overlap (not completely overlap) with the region where the recessed portion is located. For example, the first partition wall 021 is formed on the first cushion block 011, the second partition wall 022 is formed on the second cushion block 022012, a portion of the first partition wall 021 is located between the first cushion block 011 and the second cushion block 012, and a portion of the second partition wall 022 is located between the first cushion block 011 and the second cushion block 012.

In step 703, a source-drain layer is deposited on the side of the base insulating layer away from the base cushion layer, the source-drain layer including: a source located on a side of the first partition wall away from the base cushion layer, and a drain located on a side of the second partition wall away from the base cushion layer, and a gap being provided between the source and the drain.

Figure 13:
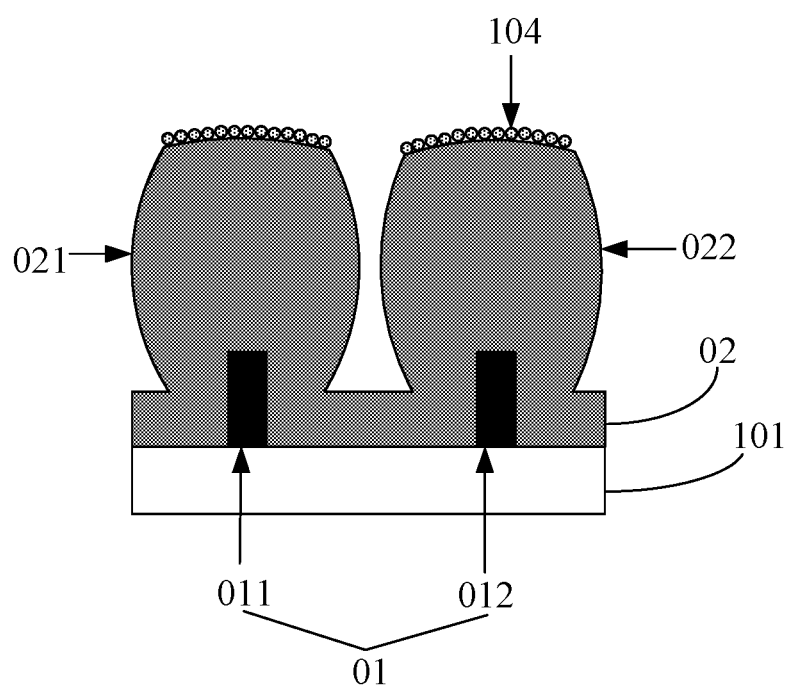
FIG. 13 is a schematic diagram of a manufacturing process of another thin film transistor provided by an embodiment of the present disclosure.
Figure 14:
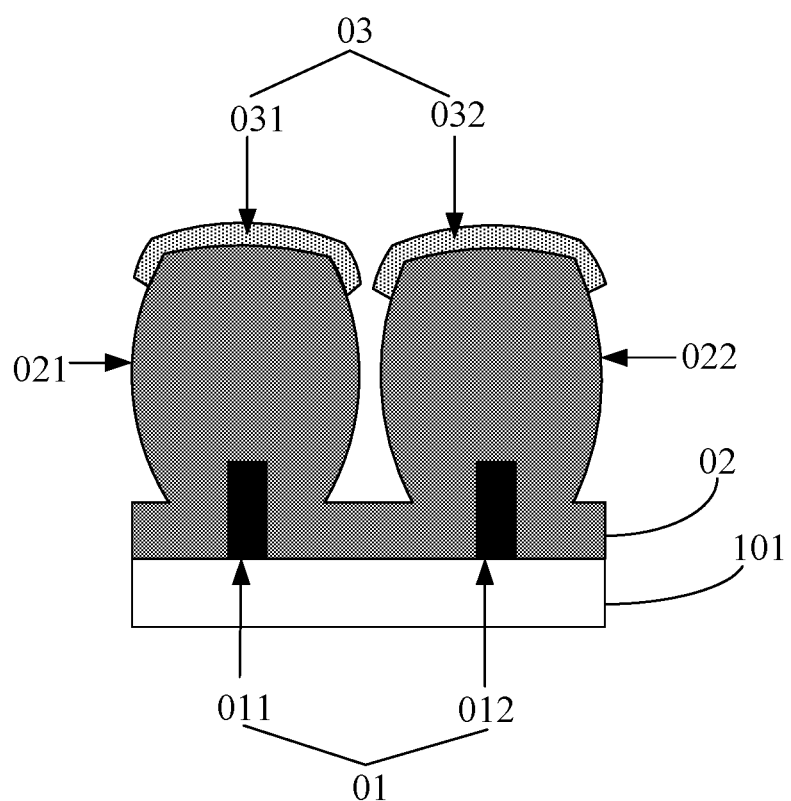
FIG. 14 is a schematic diagram of a manufacturing process of another thin film transistor provided by an embodiment of the present disclosure.

After the base insulating layer 02 is prepared, as shown in FIG. 13, an electrode material 104 may be deposited on the base insulating layer 02 to obtain the source-drain layer 03 shown in FIG. 14. The source-drain layer 03 may include the source 031 and the drain 032 that are spaced apart. The source 031 may be located on the first partition wall 021, and the drain 032 may be located on the second partition wall 022.

Exemplarily, a deposition process using a PVD or CVD method can be used to obtain the source-drain layer 03 in the embodiment of the present disclosure. It is to be noted that when the electrode material is deposited, it is also necessary to control the thickness of the deposited electrode material, so that the source and the drain are spaced apart.

In step 704, an active layer is formed on a side of the source-drain layer away from the base cushion layer.

Figure 15:
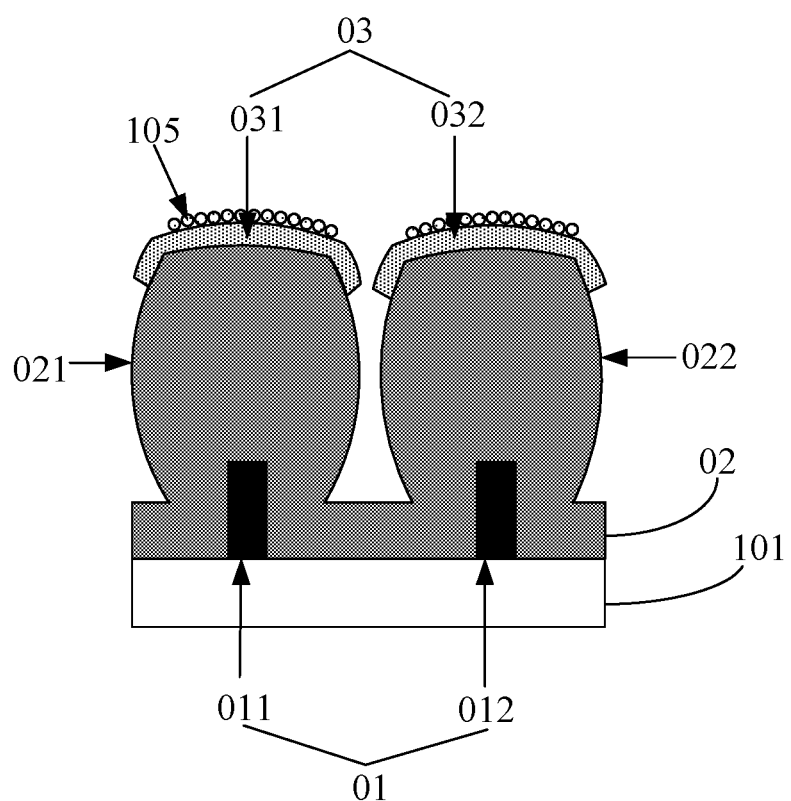
FIG. 15 is a schematic diagram of a manufacturing process of another thin film transistor provided by an embodiment of the present disclosure.
Figure 16:
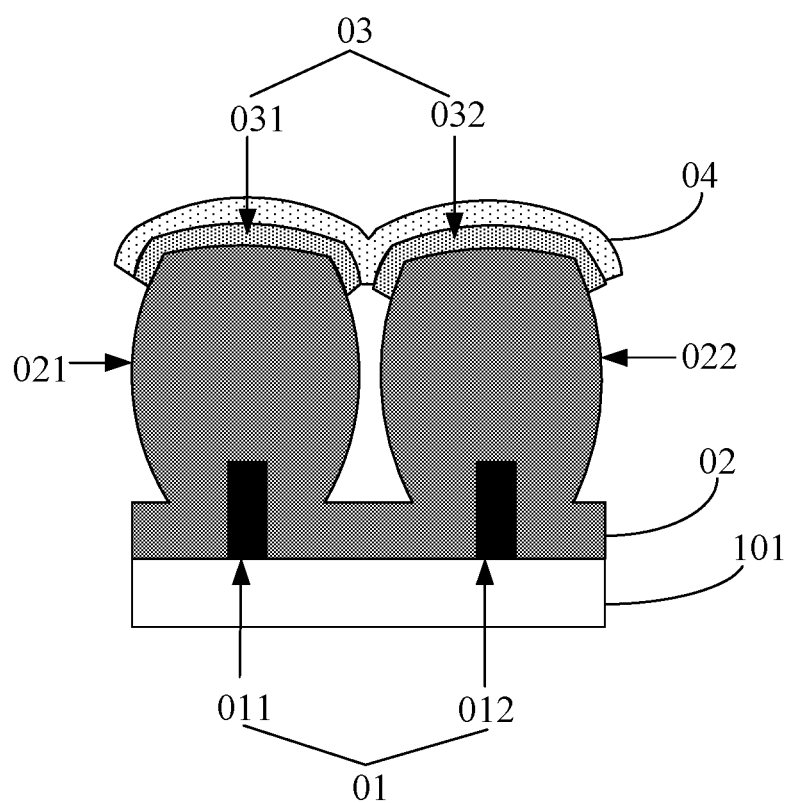
FIG. 16 is a schematic diagram of a manufacturing process of another thin film transistor provided by an embodiment of the present disclosure.

After the source-drain layer 03 has been prepared, as shown in FIG. 15, an active material 105 can be deposited on the source-drain layer 03 to obtain the active layer 04 shown in FIG. 16. The active layer 04 may include a first region covering the source 031 (the first region is electrically connected to the source), a second region covering the drain 032 (the second region is electrically connected to the drain), and a middle region connecting the first region and the second region.

Exemplarily, a deposition process using a PVD or CVD method can be used to obtain the base insulating layer 02 in the embodiment of the present disclosure. Optionally, other methods can also be used to prepare the active layer in step 704. For example, a patterning treatment may be used to prepare the active layer, which is not limited by the embodiment of the present disclosure.

In step 705, a first gate insulating layer is formed on a side of the active layer away from the base cushion layer.

Figure 17:
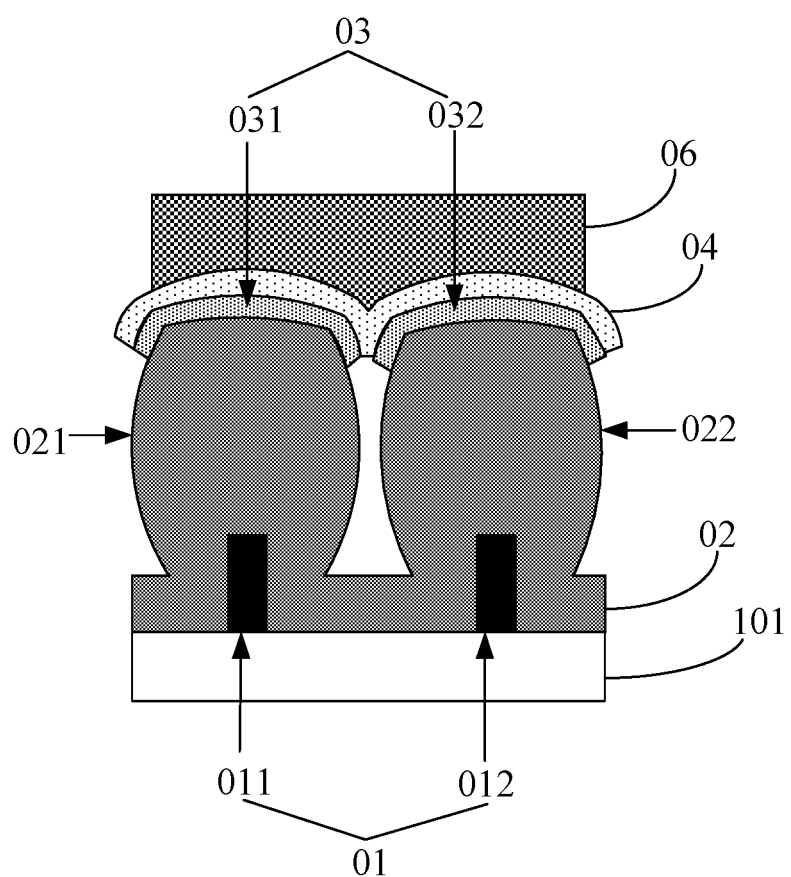
FIG. 17 is a schematic diagram of a manufacturing process of another thin film transistor provided by an embodiment of the present disclosure.

After the active layer 04 is prepared, as shown in FIG. 17, the first gate insulating layer 06 may be formed on the active layer 04. Exemplarily, methods such as coating, PVD or CVD are used to form the first gate insulating layer 06.

In step 706, a second gate layer is formed on a side of the first gate insulating layer away from the base cushion layer.

After the first gate insulating layer 06 is prepared, as shown in FIG. 1, the second gate layer 05 may be formed on the first gate insulating layer 06. For the process of preparing the second gate layer 05, a reference can be made to the process of preparing the base cushion layer in step 701, and is not repeated by the embodiment of the present disclosure here.

To sun up, in the method of manufacturing the thin film transistor provided by the embodiment of the present disclosure, the base cushion layer having the recessed portion is formed first, and then the base insulating layer is deposited on the side of the base cushion layer where the recessed portion is located. Under the action of the recessed portion, the surface of the base insulating layer away from the base cushion layer may have the first partition wall and the second partition wall that are spaced apart. Then, a conductive material is further deposited on the first partition wall and the second partition wall, so as to obtain the deposited source-drain layer. During the deposition used in forming the source-drain layer, the thickness of deposition can be controlled to achieve an accurate control on the gap between the source and the drain in the source-drain layer. Therefore, the gap can be accurately controlled to reach a small dimension, and thus the size of the thin film transistor can be reduced.

It is to be noted that the embodiment of the present disclosure only takes the manufacture of the thin film transistor shown in FIG. 1 as an example to elaborate the process of manufacturing the thin film transistor. For the processes of manufacturing other thin film transistors provided by the embodiments of the present disclosure, reference can be made to the process of manufacturing the thin film transistor shown in FIG. 1.

Exemplarily, when the thin film transistor shown in FIG. 2 is manufactured, step 705 and step 706 in FIG. 8 may be omitted; and the base material of the base material layer used for forming the base cushion layer in step 701 may be any material.

Additionally and exemplarily, when the thin film transistor shown in FIG. 3 is manufactured, step 705 and step 706 in FIG. 8 may be omitted; and the base material of the base material layer used for forming the base cushion layer in step 701 may be any material. Furthermore, before the execution of step 701, it is further necessary to sequentially form a third gate layer and a second gate insulating layer on the substrate, reference can be made to the process of forming the second gate layer in step 705 for the process for forming the third gate layer, and for the process for forming the second gate insulating layer, reference can be made to the process of forming the first gate insulating layer in step 706, which is not repeated by the embodiment of the present disclosure here.

Additionally and exemplarily, when the thin film transistor shown in FIG. 4 is manufactured, the base material of the base material layer used for forming the base cushion layer in step 701 may be any material. Furthermore, before the execution of step 701, it is further necessary to sequentially form a third gate layer and a second gate insulating layer on the substrate, reference can be made to the process of forming the second gate layer in step 705 for the process for forming the third gate layer, and for the process for forming the second gate insulating layer, reference can be made to the process of forming the first gate insulating layer in step 706, which is not repeated by the embodiment of the present disclosure here.

Additionally and exemplarily, when the thin film transistor shown in FIG. 5 or FIG. 6 is manufactured, the structure of the base cushion layer formed in step 701 may be different from that of the base cushion layer 01 shown in FIG. 10.

An embodiment of the present disclosure further provides a thin film transistor device. The thin film transistor device may include: any thin film transistor provided by the above embodiments of the present disclosure. For example, the thin film transistor device may include the above-mentioned thin film transistor (such as the thin film transistor 0 shown in FIG. 1, FIG. 2, FIG. 3, FIG. 4, FIG. 5 or FIG. 6).

An embodiment of the present disclosure further provides a chip. The chip may include any thin film transistor provided by the above embodiments of the present disclosure. For example, the chip may include the above-mentioned thin film transistor (such as the thin film transistor 0 shown in FIG. 1 to FIG. 4). Optionally, the chip may be a glass-based circuit chip.

An embodiment of the present disclosure further provides a display substrate. The display substrate may include any thin film transistor provided by the above embodiments of the present disclosure. The display substrate may be a display substrate in any display apparatus. Exemplarily, the display substrate may be an array substrate or a color film substrate in a liquid crystal display apparatus. The display substrate may also be an array substrate in an organic light-emitting diode (OLED) display panel.

An embodiment of the present disclosure further provides a display apparatus. The display apparatus may include any thin film transistor provided by the above embodiments of the present disclosure. For example, the display apparatus may include the above-mentioned thin film transistor (such as the thin film transistor 0 shown in FIG. 1, FIG. 2, FIG. 3, FIG. 4, FIG. 5 or FIG. 6). Exemplarily, the display apparatus may be any product or component having a display function such as a display panel, electronic paper, a mobile phone, a tablet computer, a television, a display, a notebook computer, a digital photo frame and a navigator.

As the thin film transistor provided by the embodiments of the present disclosure has a relatively small size, the display apparatus produced from the thin film transistor may have a large pixels per inch (PPI). The display apparatus may be applied to augmented reality (AR) display (the display apparatus is an AR display apparatus in this case), or, the display apparatus may be applied to virtual reality (VR) display (the display apparatus is a VR display apparatus in this case).

It is to be noted that a mutual reference can be made to the method embodiments provided by the embodiments of the present disclosure and the corresponding embodiments of the thin film transistor, which is not limited by the embodiments of the present disclosure. An order of the steps of the method provided in the embodiments of the present disclosure may be properly adjusted, and the step(s) may be omitted or new step(s) may be added according to practical requirement. Modified methods which can be readily obtained by those skilled in the art within the technical scope disclosed by the present disclosure shall fall within the protection scope of the present disclosure and thus is not repeated here.

The foregoing descriptions are merely optional embodiments of the present disclosure, and are not intended to limit the present disclosure. Within the spirit and principles of the disclosure, any modifications, equivalent substitutions, improvements, etc., are within the protection scope of the present disclosure.

What is claimed is:

1. A thin film transistor, comprising: a base cushion layer, a base insulating layer, a source-drain layer, an active layer, a second gate layer and a first gate insulating layer, wherein
   the basic cushion layer has a recessed portion;
   the base insulating layer is located on a side of the base cushion layer where an opening of the recessed portion is located; the base insulating layer has, on a side of the base insulating layer away from the base cushion layer, a first partition wall and a second partition wall that are and protruded in a direction away from the base cushion layer and spaced apart, and an orthographic projection region of a gap region between the first partition wall and the second partition wall onto the base cushion layer is located at a region where the recessed portion is located; and both orthographic projection regions of the first partition wall and the second partition wall onto the base cushion layer partially overlap with the region where the recessed portion is located;
   both the source-drain layer and the active layer are located on the side of the base insulating layer away from the base cushion layer, and arranged sequentially along a direction away from the base cushion layer; and
   both the second gate layer and the first gate insulating layer are located on a side of the active layer away from the basic cushion layer, and the first gate insulating layer is located between the active layer and the second gate layer.

2. The thin film transistor according to claim 1, wherein the base cushion layer comprises: a first cushion block and a second cushion block that are spaced apart, and the recessed portion is located between the first cushion block and the second cushion block.

3. The thin film transistor according to claim 1, wherein a recession depth of the recessed portion ranges from 5 nm to 50 μm; and
   a width of the recessed portion ranges from 5 nm to 50 μm in an arrangement direction of a source and a drain in the source-drain layer.

4. The thin film transistor according to claim 1, wherein a spacing between the source and the drain in the source-drain layer ranges from 1 nm to 5 μm.

5. The thin film transistor according to claim 1, wherein a material of the basic cushion layer comprises a conductive material, and the basic cushion layer serves as a first gate layer in the thin film transistor.

6. The thin film transistor according to claim 1, wherein the thin film transistor further comprises: a third gate layer and a second gate insulating layer that are located on the side of the basic cushion layer away from the basic insulating layer, and the second gate insulating layer is located between the active layer and the third gate layer.

7. The thin film transistor according to claim 1, wherein the base cushion layer comprises: a substrate, as well as a first bump and a second bump that are spaced apart and located on one side of the substrate, and the recessed portion is located between the first bump and the second bump.

8. A method for manufacturing a thin film transistor the method comprising:
   forming a base cushion layer having a recessed portion;
   depositing a base insulating layer on a side of the base cushion layer where an opening of the recessed portion is located, wherein the base insulating layer has, on a side of the base insulating layer away from the base cushion layer, a first partition wall and a second partition wall that are and protruded in a direction away from the base cushion layer and spaced apart, and an orthographic projection region of a gap region between the first partition wall and the second partition wall onto the base cushion layer is within a region where the recessed portion is located; and both orthographic projection regions of the first partition wall and the second partition wall onto the base cushion layer partially overlap with the region where the recessed portion is located;
   depositing a source-drain layer on the side of the base insulating layer away from the base cushion layer,
   forming an active layer on a side of the source-drain layer away from the base cushion layer;
   forming a first gate insulating layer on a side of the active layer away from the base cushion layer; and
   forming a second gate layer on a side of the first gate insulating layer away from the base cushion layer.

9. The method according to claim 8, wherein forming the active layer on the side of the source-drain layer away from the base cushion layer comprises:
   depositing the active layer on the side of the source-drain layer away from the base cushion layer.

10. The method according to claim 8, wherein forming the base cushion layer having the recessed portion comprises:
    forming a base material layer; and
    treating the base material layer with a photoetching technology to obtain the base cushion layer.

11. The method according to claim 8, wherein a material of the base cushion layer comprises a conductive material, the base cushion layer being a first gate layer in the thin film transistor.

12. The method according to claim 8, wherein before forming the base cushion layer having the recessed portion, the method further comprises:
    forming a third gate layer and a second gate insulating layer that are stacked, and
    forming the base cushion layer having the recessed portion comprises:
    forming the base cushion layer on a side of the second gate insulating layer away from the third gate layer.

13. A display apparatus, comprising a thin film transistor, and the thin film transistor comprising: a base cushion layer, a base insulating layer, a source-drain layer, an active layer, a second gate layer and a first gate insulating layer, wherein
    the basic cushion layer has a recessed portion;
    the base insulating layer is located on a side of the base cushion layer where an opening of the recessed portion is located; the base insulating layer has, on a side of the base insulating layer away from the base cushion layer, a first partition wall and a second partition wall that are and protruded in a direction away from the base cushion layer and spaced apart, and an orthographic projection region of a gag region between the first partition wall and the second partition wall onto the base cushion layer is located at a region where the recessed portion is located; and both orthographic projection regions of the first partition wall and the second partition wall onto the base cushion layer partially overlap with the region where the recessed portion is located;

both the source-drain layer and the active layer are located on the side of the base insulating layer away from the base cushion layer, and arranged sequentially along a direction away from the base cushion layer; and both the second gate layer and the first gate insulating layer are located on a side of the active layer away from the basic cushion layer, and the first gate insulating layer is located between the active layer and the second gate layer.

14. The display apparatus according to claim 13, wherein the base cushion layer comprises: a first cushion block and a second cushion block that are spaced apart, and the recessed portion is located between the first cushion block and the second cushion block.

15. The display apparatus according to claim 13, wherein the base cushion layer comprises: a substrate, as well as a first bump and a second bump that are spaced apart and located on one side of the substrate, and the recessed portion is located between the first bump and the second bump.

16. The display apparatus according to claim 13, wherein a recession depth of the recessed portion ranges from 5 nm to 50 μm; and a width of the recessed portion ranges from 5 nm to 50 μm in an arrangement direction of a source and a drain in the source-drain layer.

17. The display apparatus according to claim 13, wherein a spacing between the source and the drain in the source-drain layer ranges from 1 nm to 5 μm.

18. The display apparatus according to claim 13, wherein a material of the basic cushion layer comprises a conductive material, and the basic cushion layer serves as a first gate layer in the thin film transistor.

19. The display apparatus according to claim 13, wherein the thin film transistor further comprises: a third gate layer and a second gate insulating layer that are located on the side of the basic cushion layer away from the basic insulating layer, and the second gate insulating layer is located between the active layer and the third gate layer.

* * * * *